(12) United States Patent
Lee

(10) Patent No.: US 7,442,606 B2
(45) Date of Patent: Oct. 28, 2008

(54) METHOD OF MANUFACTURING A SEMICONDUCTOR DEVICE

(75) Inventor: In No Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/771,803

(22) Filed: Jun. 29, 2007

(65) Prior Publication Data

US 2008/0102619 A1    May 1, 2008

(30) Foreign Application Priority Data

Oct. 31, 2006   (KR) ...................... 10-2006-0106613

(51) Int. Cl.
*H01L 21/336* (2006.01)
(52) U.S. Cl. ...................... 438/257; 438/583; 438/738; 257/E21.68; 257/E21.029

(58) Field of Classification Search ......... 438/257–267, 438/570, 581, 583, 736, 737, 738; 257/314–321, 257/E29.129, E29.3, E21.179, E21.422, E21.68, 257/E21.687, E21.688, E21.029
See application file for complete search history.

(56) References Cited

U.S. PATENT DOCUMENTS

| | | | |
|---|---|---|---|
| 6,218,689 B1 * | 4/2001 | Chang et al. | 257/288 |
| 6,380,029 B1 * | 4/2002 | Chang et al. | 438/257 |
| 2007/0004140 A1 * | 1/2007 | Jang et al. | 438/257 |

* cited by examiner

*Primary Examiner*—Brook Kebede
(74) *Attorney, Agent, or Firm*—Townsend and Townsend and Crew LLP

(57) ABSTRACT

A method of manufacturing a semiconductor device includes providing a semiconductor substrate in which a floating gate pattern is formed. A dielectric layer, a conductive layer for a control gate, a tungsten silicide layer, a first silicon oxynitride layer, a hard mask layer, a second silicon oxynitride layer and an Organic Bottom Anti-Reflective Coating (BARC) layer are formed over the semiconductor substrate including the floating gate pattern. The BARC layer, the second silicon oxynitride layer, the hard mask layer and the first silicon oxynitride layer are removed. The tungsten silicide layer and the conductive layer for the control gate are removed. The dielectric layer is removed to form spacers on sides of the floating gate. The floating gate is then removed.

25 Claims, 7 Drawing Sheets

METHOD OF MANUFACTURING A SEMICONDUCTOR DEVICE

CROSS-REFERENCES TO RELATED APPLICATIONS

The present application claims priority to Korean patent application number 10-2006-106613, filed on Oct. 31, 2006, which is incorporated by reference in its entirety.

BACKGROUND OF THE INVENTION

The present invention relates, in general, to a semiconductor device and, more particularly, to a method of manufacturing a semiconductor device, which can improve the yield and quality of the semiconductor device of 60 nm or less.

Semiconductor memory devices for storing data can be classified into volatile memory devices or nonvolatile memory devices. A volatile memory device loses data when a power supply is removed, whereas a nonvolatile memory device retains data when a power supply is removed.

A nonvolatile memory device includes a flash memory device. A unit cell of the flash memory device generally includes an active region defined on a specific region of a semiconductor substrate, a tunnel insulating layer formed on the active region, a floating gate formed on the tunnel insulating layer, a gate interlayer insulating layer formed on the floating gate, and a control gate electrode formed on the gate interlayer insulating layer. In particular, a flash memory device has been widely used with MP3 players, digital cameras, memory for bios storage of a computer, mobile phones, portable data storage devices and the like.

The flash memory cell can store data as external voltage applied to the control gate electrode is coupled to the floating gate. Accordingly, to store data within a short period of time and at a low programming voltage, the ratio of voltage applied to the control gate electrode to voltage applied to the floating gate must be high. The ratio of voltage applied to the control gate electrode to voltage applied to the floating gate is called a "coupling ratio". The coupling ratio can be expressed by the ratio of the capacitance of the gate interlayer insulating layer to the sum of the capacitance of the tunnel insulating layer and the gate interlayer insulating layer.

As devices become high integrated, a gate etch process in devices 60 nm or less becomes difficult.

SUMMARY OF THE INVENTION

Accordingly, the present invention discloses a method of manufacturing a semiconductor device which can improve an increase in variation of threshold voltage (Vt), which is caused by a defective photoresist pattern generated due to the shortage of a photoresist pattern margin during a gate etch process, can prevent an active region from being damaged or a portion the polysilicon layer from remaining, and can improve an increase of a coupling ratio (CR) due to a defective profile.

According to an aspect of the present invention, a method of manufacturing a semiconductor device includes providing a semiconductor substrate in which a floating gate pattern is formed. A dielectric layer, a conductive layer for a control gate, a tungsten silicide layer, a first silicon oxynitride layer, a hard mask layer, a second silicon oxynitride layer and an Organic Bottom Anti-Reflective Coating (BARC) layer are formed over the semiconductor substrate including the floating gate pattern. The BARC layer, the second silicon oxynitride layer, the hard mask layer and the first silicon oxynitride layer are removed. The tungsten silicide layer and the conductive layer for the control gate are removed. The dielectric layer is removed to form spacers on sides of the floating gate. The floating gate is then removed.

In a device of 60 nm or less, if a gate etch process technology used in a device of 70 nm or less is used without modification during the gate etch process, the following problems occur.

First, as the device shrinks, the thickness of a photoresist pattern for etching the device becomes thin. If an underlying hard mask layer is etched using the thin photoresist pattern as a mask, the hard mask layer is removed and the hard mask layer pattern is deformed due to a short margin of the photoresist pattern. Thus, the hard mask layer is ineffective. Furthermore, the line width of the gate line is not uniform and threshold voltage (Vt) distributions are increased.

Second, in a device of 70 nm, if a gate etch process is performed using a mask used during a floating gate etch process, an active region is not attached during a dielectric layer etch process since the floating gate completely surrounds the active region. However, if the gate etch process is performed using the above mask in an Advanced Self-Aligned Shallow Trench Isolation (ASA-STI) scheme, the active region is attached.

Third, if the photoresist pattern formed on the hard mask layer is removed after the hard mask layer etch process is performed, and the gate etch process is continuously performed, the sides of the gate line are attached due to a high Aspect Ratio (AR).

DESCRIPTION OF SPECIFIC EMBODIMENTS

Specific embodiments according to the present patent will be described with reference to the accompanying drawings.

Figure 1:
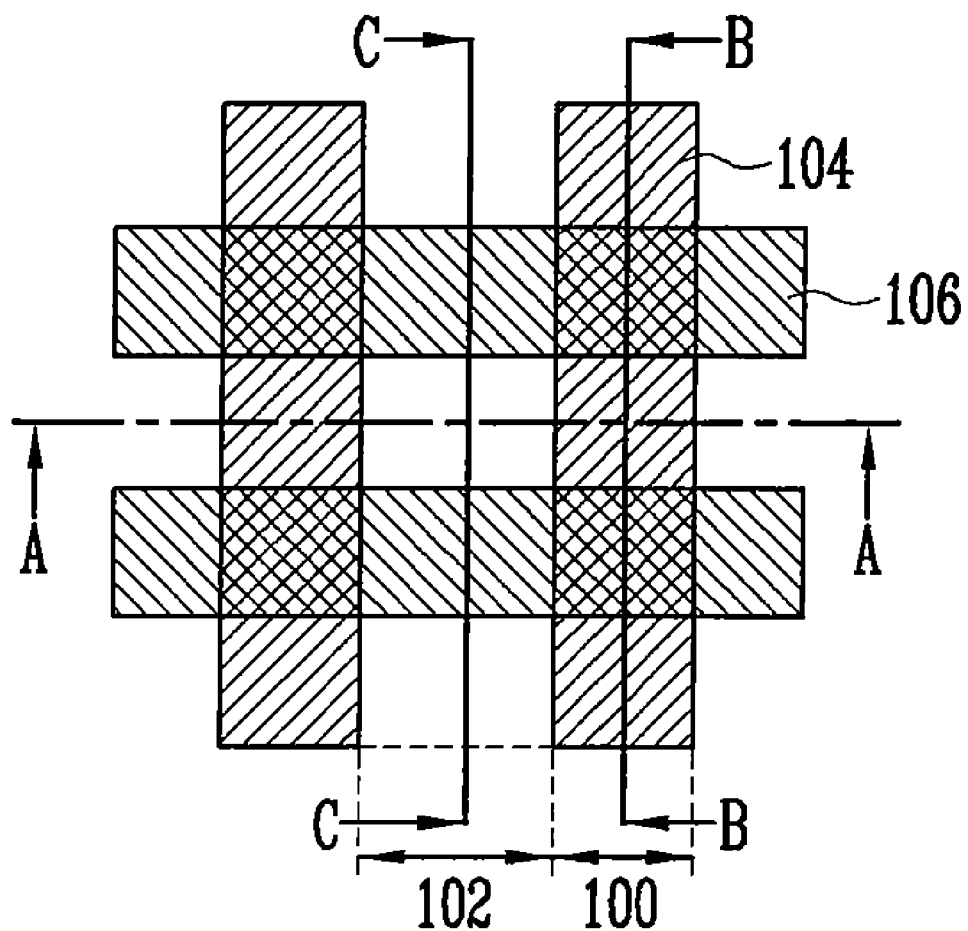
FIG. 1 is a layout diagram of a flash memory device according to the present invention.

FIG. 1 is a layout diagram of a flash memory device according to the present invention.

An isolation layer is formed in line form in a specific region of a semiconductor substrate, thereby defining an active region 100 and a field region 102. A tunnel insulating layer and a floating gate 104 are formed in a specific region of the active region 100. A control gate 106 overlapping the floating gate 104, and crossing the active region 100 and the field region 102 is then formed.

FIGS. 2A to 2G are cross-sectional views of the flash memory device taken along line A-A in FIG. 1. FIGS. 2A to 2G sequentially illustrate etch process steps for forming a gate using an ASA-STI scheme.

Figure 2A:
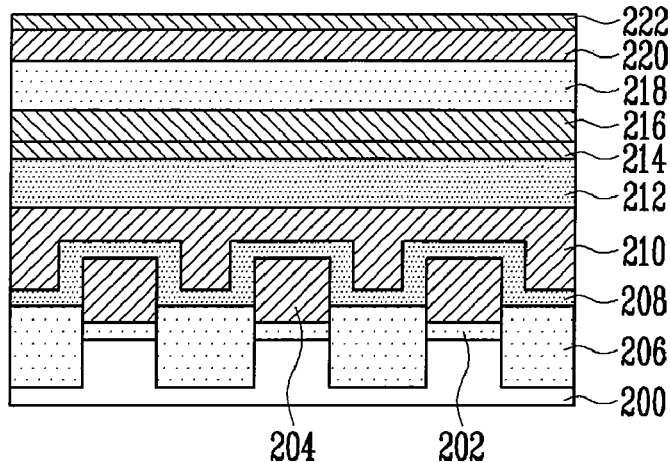
FIGS. 2A to 2G are cross-sectional views of the flash memory device taken along line A-A in FIG. 1.

Referring to FIG. 2A, a tunnel insulating layer 202 and a first conductive layer 204 for a floating gate are formed over a semiconductor substrate 100. The first conductive layer 204, the tunnel insulating layer 202 and the semiconductor substrate 200 are partially etched to form trenches. The tunnel insulating layer 202 can be formed from an oxide layer, and the first conductive layer 204 can be formed from a polysilicon layer.

The trenches are filled with an insulating layer, for example, a High Density Plasma (HDP) oxide layer, to form isolation layers 206. As the isolation layers 206 are formed, an active region and a field region are defined. In order to lower the Effective Field Height (EFH) of the isolation layers 206, the top surfaces of the isolation layers 206 are partially etched. The surface of the isolation layer 206 is lower than that of the first conductive layer 204. As the top surface of the isolation layer 206 is partially etched, the surface of the semiconductor substrate 200, including the isolation layers 206, has an irregular shape.

A dielectric layer 208 and a second conductive layer 210 for a control gate are sequentially formed over the semiconductor substrate 200 including the isolation layers 206. The second conductive layer 210 can be formed from a polysilicon layer. The second conductive layer 210 is polished. The polishing process can include performing an etch-back process or a Chemical Mechanical Polishing (CMP) process. After the second conductive layer 210 is formed, the polishing process may not be performed because the second conductive layer 210 formed on the isolation layers 206 has a thickness that is larger than that of the second conductive layer 210 formed on the first conductive layer 204.

A tungsten silicide (WSix) layer 212, a first silicon oxynitride (SiON) layer 214, a first hard mask layer 216, a second hard mask layer 218, a second silicon oxynitride (SiON) layer 220, and an Organic Bottom Anti-Reflective Coating (BARC) layer 222 are sequentially formed over the second conductive layer 210. The first silicon oxynitride layer 214 prevents the tungsten silicide layer 212 from being oxidized when the first hard mask layer 216 is formed. The first hard mask layer 216 can be formed at a thickness of approximately 300 to approximately 1000 angstroms using an oxide layer, i.e., an insulating layer, so that the first hard mask layer 216 is not removed during a subsequent etch process of the second conductive layer 210. The second hard mask layer 218 can be formed using an amorphous carbon layer (ACL) or a polymer of a Spin On Coating (SOC) method. The second silicon oxynitride layer 220 serves as an anti-reflective coating layer, and lowers the thickness of the BARC layer 222.

Figure 2B:
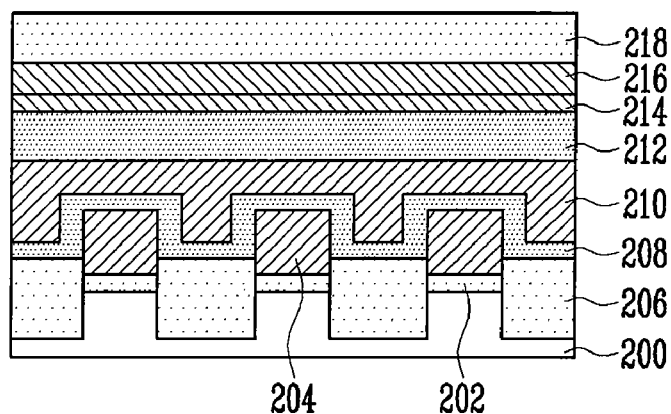

Referring to FIG. 2B, the BARC layer 222 and the second silicon oxynitride layer 220 are removed by photo and etch processes. The BARC layer 222 and the second silicon oxynitride layer 220 can be removed using a pressure of approximately 60 to approximately 200 mT, a source power of approximately 300 to approximately 1000 W at a frequency of approximately 20 to approximately 40 MHz, and a mixed gas of $CF_4$ and $O_2$.

Figure 2C:
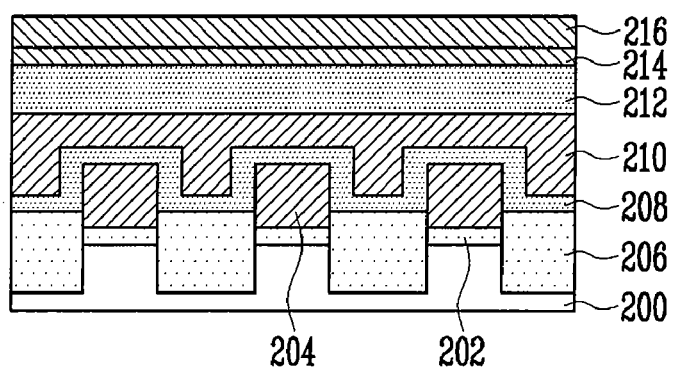

Referring to FIG. 2C, the second hard mask layer 218 is removed by photo and etch processes. The second hard mask layer 218 can be removed using a pressure of approximately 100 to approximately 200 mT, a source power of approximately 500 to approximately 1500 W at a frequency of approximately 20 to approximately 40 MHz, and a mixed gas of $N_2$ and $H_2$, a mixed gas of $N_2$ and $O_2$, or a gas in which $CH_3F$, $CO$ or $CO_2$ is added to a mixed gas of $N_2$ and $H_2$.

Figure 2D:
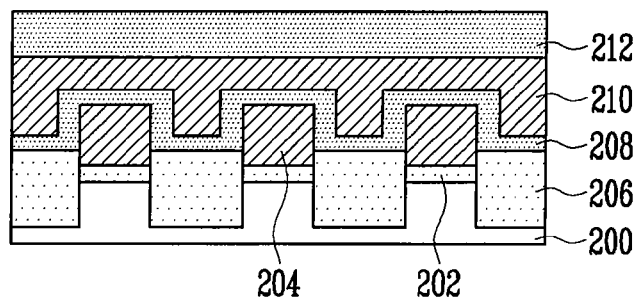

Referring to FIG. 2D, the first hard mask layer 216 and the first silicon oxynitride layer 214 are removed by photo and etch processes. The first hard mask layer 216 and the first silicon oxynitride layer 214 can be removed using a pressure of approximately 100 to approximately 200 mT, a source power of approximately 100 to approximately 200 W at a frequency of approximately 20 to approximately 40 MHz, a bias power of approximately 200 to approximately 1000 W at a frequency of 1 to 10 MHz, and a mixed gas of $CF_4$, $CHF_3$ and $O_2$. The BARC layer 222, the second silicon oxynitride layer 220, the second hard mask layer 218, the first hard mask layer 216 and the first silicon oxynitride layer 214 are removed in-situ using Inductively Coupled Plasma (ICP) type equipment.

Figure 2E:
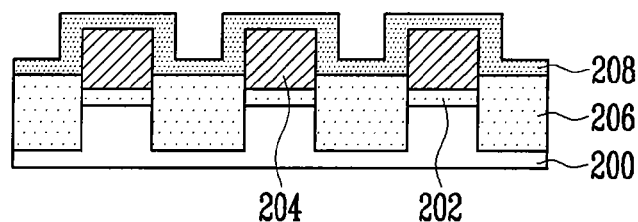

Referring to FIG. 2E, the tungsten silicide layer 212 and the second conductive layer 210 are removed by photo and etch processes. The tungsten silicide layer 212 is removed using a two-step etch process. The tungsten silicide layer 212 is first etched using a mixed gas of $NF_3$, $Cl_2$, $O_2$ and $N_2$ at a pressure of approximately 3 to approximately 15 mT and is then over-etched using a mixed gas of $Cl_2$, Ar and $N_2$. During the over-etch process of the tungsten silicide layer 212, the tungsten silicide layer 212 is removed without damaging the dielectric layer 208 such that an etch rate of the tungsten silicide layer 212 is set from approximately 20 to approximately 50 angstroms/sec while maintaining the etch selectivity between the tungsten silicide layer 212 and the dielectric layer 208 from approximately 10:1 to approximately 30:1.

The second conductive layer 210 is then removed using a mixed gas of HBr and $O_2$ where the ratio of the source power and the bias power is set from approximately 1:1 to approximately 2:1 at a pressure of approximately 10 to approximately 50 mT. During the etch process of the second conductive layer 210, the etch selectivity between the second conductive layer 210 and the dielectric layer 208 is set from approximately 20:1 to approximately 200:1. Thus, the dielectric layer 208 formed on the first conductive layer 204 is not damaged, but the second conductive layer 210 formed on the isolation layers 206 is removed, so that a vertical profile of the second conductive layer 210 can be secured.

Figure 2F:
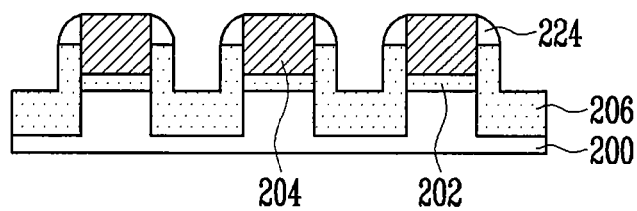

Referring to FIG. 2F, the dielectric layer 208 is removed by photo and etch processes, thereby forming spacers 224 on sidewalls of the first conductive layer 204. The dielectric layer 208 can be removed using $CF_4$ at a pressure of approximately 3 to approximately 15 mT, and the etch selectivity of the dielectric layer 208 and the first polysilicon layer 204 can be set from approximately 1:1 to approximately 1.5:1. The spacers 224 are formed at a thickness of approximately 200 to approximately 500 angstroms. The isolation layers 206 are partially etched using the spacers 224 as a mask.

Figure 2G:
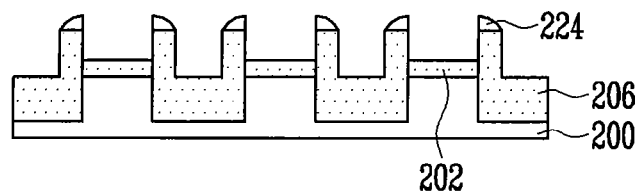

Referring to FIG. 2G, the first conductive layer 204 is removed by photo and etch processes. The first conductive layer 204 can be removed using a two-step process. The first conductive layer 204 is first removed using a mixed gas of HBr and He. The etch selectivity of the first conductive layer 204 and the tunnel insulating layer 202 is set to approximately 10:1 to approximately 30:1 so that the first conductive layer 204 is removed and less polymer is generated. The first conductive layer 204 is then over-etched using a mixed gas of HBr and $O_2$ without removing the tunnel insulating layer 202 such that the etch selectivity of the first conductive layer 204 and the tunnel insulating layer 202 is set from approximately 50:1 to approximately 150:1. The tungsten silicide layer 212, the second conductive layer 210, the dielectric layer 208 and the first conductive layer 204 are etched in-situ using ICP-type equipment. During removal of the first conductive layer 204, the spacers 224 protect the active region at a boundary of the field region. During removal of the first conductive layer 204, the spacers 224 remain at a thickness of approximately 0 to approximately 200 angstroms.

FIGS. 3A to 3G are cross-sectional views of the flash memory device taken along line B-B in FIG. 1. FIGS. 3A to 3G sequentially illustrate etch process steps for forming a gate on the active region using an ASA-STI scheme, wherein the field region of the semiconductor substrate is not shown.

Figure 3A:
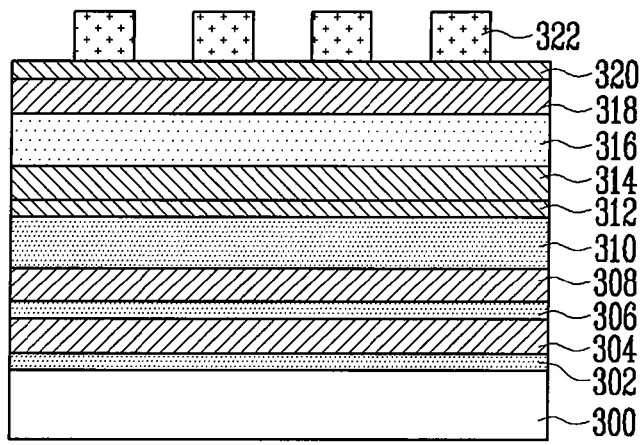
FIGS. 3A to 3G are cross-sectional views of the flash memory device taken along line B-B in FIG. 1.

Referring to FIG. 3A, a tunnel insulating layer 302, a first conductive layer 304 for a floating gate, a dielectric layer 306 and a second conductive layer 308 for a control gate are sequentially formed over a semiconductor substrate 300. The tunnel insulating layer 302 can be formed from an oxide layer, and the first conductive layer 304 and the second conductive layer 308 can be formed from a polysilicon layer. The second conductive layer 308 is then polished. The polishing process can include performing an etch-back process or a CMP process.

A tungsten silicide (WSix) layer 310, a first silicon oxynitride (SiON) layer 312, a first hard mask layer 314, a second hard mask layer 316, a second silicon oxynitride (SiON) layer 318, a BARC layer 320 and a photoresist pattern 322 are sequentially formed over the second conductive layer 308. The first silicon oxynitride layer 312 prevents the tungsten silicide layer 310 from being oxidized during formation of the first hard mask layer 314. The first hard mask layer 314 can be formed at a thickness of approximately 300 to approximately 1000 angstroms using an oxide layer, i.e., an insulating layer, so that the first hard mask layer 314 is not removed during a subsequent etch process of the second conductive layer 308. The second hard mask layer 316 can be formed using an amorphous carbon layer (ACL) or a polymer of a SOC method. The second silicon oxynitride layer 318 serves as an anti-reflective coating layer, and lowers the thickness of the BARC layer 320. The photoresist pattern 322 can be formed at a thickness of approximately 1000 to approximately 1500 angstroms.

Figure 3B:
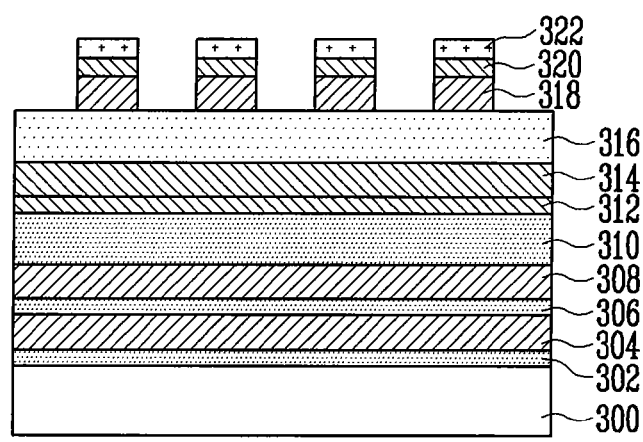

Referring to FIG. 3B, the BARC layer 320 and the second silicon oxynitride layer 318 are etched using the photoresist pattern 322 as a mask. The BARC layer 320 and the second silicon oxynitride layer 318 can be etched using a pressure of approximately 60 to approximately 200 mT, a source power of approximately 300 to approximately 1000 W at a frequency of approximately 20 to approximately 40 MHz, and a mixed gas of $CF_4$ and $O_2$. After the etch process, part of the photoresist pattern 322 remains.

Figure 3C:
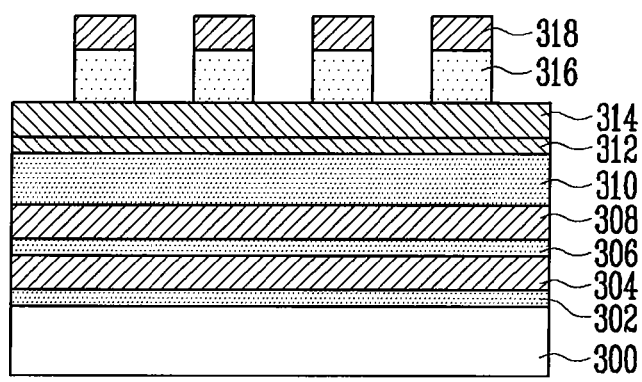

Referring to FIG. 3C, the second hard mask layer 316 is etched using the remaining photoresist pattern 322, the BARC layer 320 and the second silicon oxynitride layer 318 as masks. The second hard mask layer 316 can be etched using a pressure of approximately 100 to approximately 200 mT, a source power of approximately 500 to approximately 1500 W at a frequency of approximately 20 to approximately 40 MHz, and a mixed gas of $N_2$ and $H_2$, a mixed gas of $N_2$ and $O_2$, or a gas in which $CH_3F$, $CO$ or $CO_2$ is added to a mixed gas of $N_2$ and $H_2$. The photoresist pattern 322 and the BARC layer 320 have a similar etch selectivity, and are therefore removed during the etch process of the second hard mask layer 316.

Figure 3D:
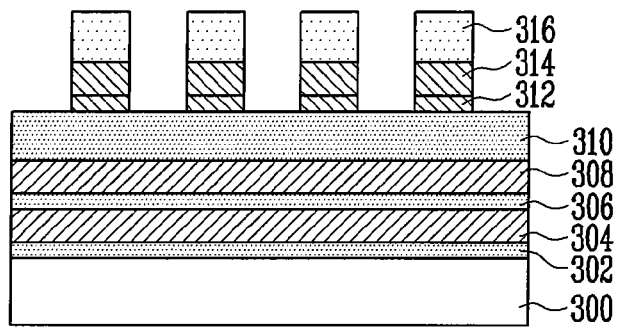

Referring to FIG. 3D, the first hard mask layer 314 and the first silicon oxynitride layer 312 are etched using the second silicon oxynitride layer 318 and the second hard mask layer 316 as masks. The first hard mask layer 314 and the first silicon oxynitride layer 312 can be etched using a pressure of approximately 100 to approximately 200 mT, a source power of approximately 100 to approximately 200 W at a frequency of approximately 20 to approximately 40 MHz, a bias power of approximately 200 to approximately 1000 W at a frequency of approximately 1 to approximately 10 MHz, and a mixed gas of $CF_4$, $CHF_3$ and $O_2$. The BARC layer 320, the second silicon oxynitride layer 318, the second hard mask layer 316, the first hard mask layer 314 and the first silicon oxynitride layer 312 are removed in-situ using ICP-type equipment. The second silicon oxynitride layer 318 is removed during the etch process of the first hard mask layer 314 and the first silicon oxynitride layer 312, and the second hard mask layer 316 is partially removed during the etch process of the first hard mask layer 314 and the first silicon oxynitride layer 312.

Figure 3E:
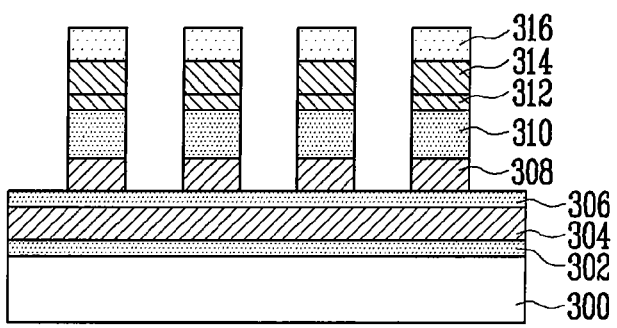

Referring to FIG. 3E, the tungsten silicide layer 310 and the second conductive layer 308 are etched using the remaining second hard mask layer 316 as a mask. The tungsten silicide layer 310 is etched using a two-step etch process. The tungsten silicide layer 310 is first etched using a mixed gas of $NF_3$, $Cl_2$, $O_2$ and $N_2$ at a pressure of approximately 3 to approximately 15 mT and is then over-etched using a mixed gas of $Cl_2$, Ar and $N_2$. During the over-etch process of the tungsten silicide layer 310, the tungsten silicide layer 310 is removed without damaging the dielectric layer 306 such that the etch rate of the tungsten silicide layer 310 is set from approximately 20 to approximately 50 angstroms/sec while maintaining an etch selectivity between the tungsten silicide layer 310 and the dielectric layer 306 from approximately 10:1 to approximately 30:1.

The second conductive layer 308 is etched using a mixed gas of HBr and $O_2$ where the ratio of the source power and the bias power is set from approximately 1:1 to approximately 2:1 at a pressure of approximately 10 to approximately 50 mT. Therefore, the second conductive layer 308 has a vertical profile.

Figure 3F:
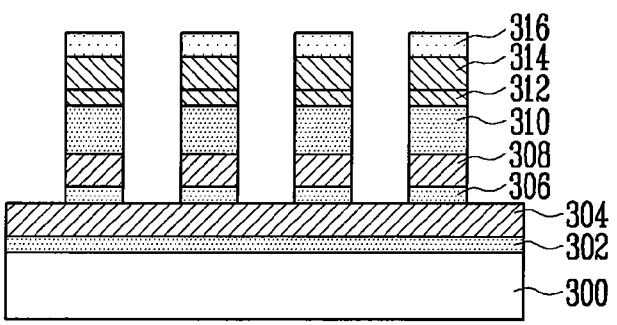

Referring to FIG. 3F, the dielectric layer 306 is etched using the remaining second hard mask layer 316 as a mask. The dielectric layer 306 can be etched using $CF_4$ at a pressure of approximately 3 to approximately 15 mT, and the etch selectivity of the dielectric layer 306 and the first polysilicon layer 304 can be set from approximately 1:1 to approximately 1.5:1.

Figure 3G:
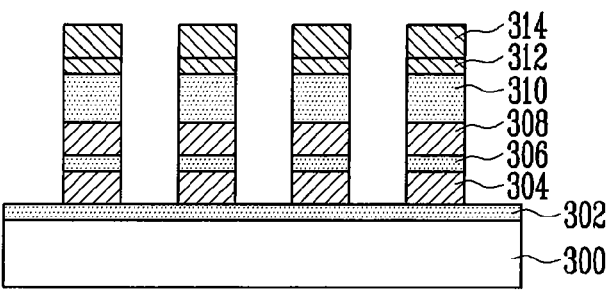

Referring to FIG. 3G, after the first conductive layer 304 is etched using the remaining second hard mask layer 316 as a mask, the remaining second hard mask layer 316 is removed to form a gate 324 having a structure in which the first conductive layer 304, the dielectric layer 306, the second conductive layer 308, the tungsten silicide layer 310, the first silicon oxynitride layer 312 and the first hard mask layer 314 are stacked. The first conductive layer 304 can be etched using a two-step process. The first conductive layer 304 is first etched using a mixed gas of HBr and He, wherein the etch selectivity of the first conductive layer 304 and the tunnel insulating layer 302 is set from approximately 10:1 to approximately 30:1 so that the first conductive layer 304 can be removed and less polymer is generated.

The first conductive layer 304 is over-etched using a mixed gas of HBr and $O_2$ without removing the tunnel insulating layer 302 such that the etch selectivity of the first conductive layer 304 and the tunnel insulating layer 302 is set from approximately 50:1 to approximately 150:1. The tungsten silicide layer 310, the second conductive layer 308, the dielectric layer 306 and the first conductive layer 304 are etched in-situ using ICP-type equipment.

As described above, during the etch process of the first conductive layer 304, the second hard mask layer 316 is used as a mask. Thus, the first conductive layer 304 can be removed with the sides of the etched gate (324) pattern not being attached as an etch target increases. Furthermore, during the etch process of the first conductive layer 304, the second hard mask layer 316 is used as a mask. Accordingly, a profile slope decreases as an etch target increases and, therefore, the CP can be controlled artificially.

After the etch process is performed up to the first silicon oxynitride layer 312, the gate 324 is formed by performing the remaining etch process using the second hard mask layer 316 as a mask without removing the second hard mask layer 316. Since the second hard mask layer 316 remains until the gate (324) pattern is formed, the first hard mask layer 314 is not removed. Thus, the thickness of the first hard mask layer 314 can be lowered. During the etch process of the first hard mask layer 314, a Critical Dimension (CD) can be controlled easily. Even during formation of the gate 324, the sides of the etched gate (324) patterns are not passivated due to material containing carbon, which is generated as the ACL. In other words, the second hard mask layer 316 is removed. Consequently, the sides of the etched gate (324) pattern are not attached.

FIGS. 4A to 4G are cross-sectional views of the flash memory device taken along line C-C in FIG. 1. FIGS. 4A to 4G sequentially illustrate etch process steps for forming a gate on a field region using an ASA-STI scheme, wherein an active region of a semiconductor substrate is not shown.

Figure 4A:
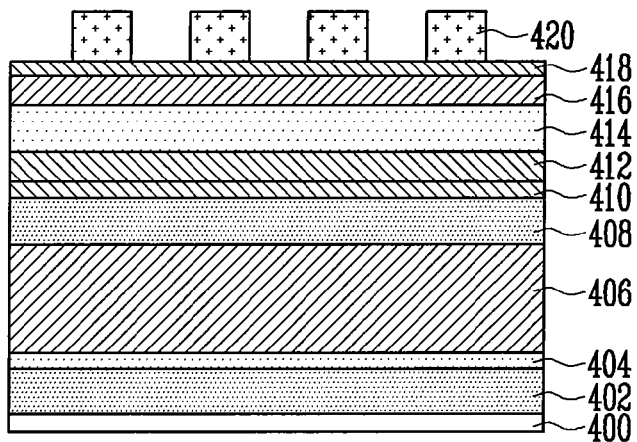
FIGS. 4A to 4G are cross-sectional views of the flash memory device taken along line C-C in FIG. 1.

Referring to FIG. 4A, isolation layers 402, a dielectric layer 404 and a conductive layer 406 for a control gate are sequentially formed over a semiconductor substrate 400. The conductive layer 406 can be formed from a polysilicon layer. The conductive layer 406 is then polished. The polishing process can include performing an etch-back process or a CMP process. After the second conductive layer 406 is formed, the polishing process may not be performed.

A tungsten silicide (WSix) layer 408, a first silicon oxynitride (SiON) layer 410, a first hard mask layer 412, a second hard mask layer 414, a second silicon oxynitride (SiON) layer 416, a BARC layer 418 and a photoresist pattern 420 are sequentially formed over the conductive layer 406. The first silicon oxynitride layer 410 prevents the tungsten silicide layer 408 from being oxidized during formation of the first hard mask layer 412. The first hard mask layer 412 can be formed at a thickness of approximately 300 to approximately 1000 angstroms using an oxide layer, i.e., an insulating layer, so that the first hard mask layer 412 is not removed during a subsequent etch process of the conductive layer 406. The second hard mask layer 414 can be formed using an amorphous carbon layer (ACL) or a polymer of a SOC method. The second silicon oxynitride layer 416 serves as an anti-reflective coating layer, and lowers the thickness of the BARC layer 418. The photoresist pattern 420 can be formed at a thickness of approximately 1000 to approximately 1500 angstroms.

Figure 4B:
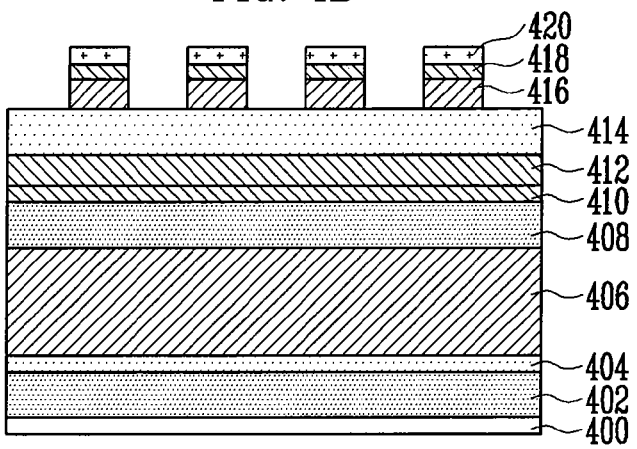

Referring to FIG. 4B, the BARC layer 418 and the second silicon oxynitride layer 416 are etched using the photoresist pattern 420 as a mask. The BARC layer 418 and the second silicon oxynitride layer 416 can be etched using a pressure of approximately 60 to approximately 200 mT, a source power of approximately 300 to approximately 1000 W at a frequency of approximately 20 to approximately 40 MHz, and a mixed gas of $CF_4$ and $O_2$. After the etch process, part of the photoresist pattern 420 remains.

Figure 4C:
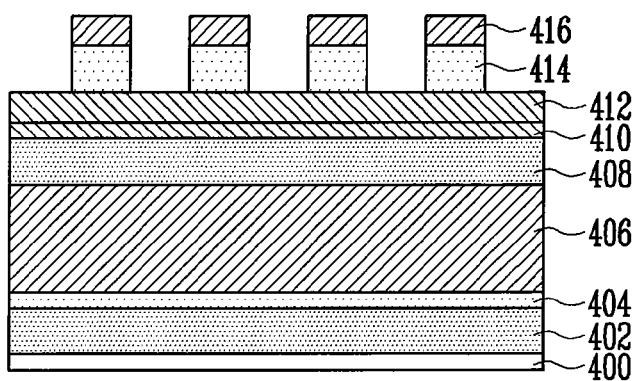

Referring to FIG. 4C, the second hard mask layer 414 is etched using the remaining photoresist pattern 420, the BARC layer 418 and the second silicon oxynitride layer 416 as masks. The second hard mask layer 414 can be etched using a pressure of approximately 100 to approximately 200 mT, a source power of approximately 500 to approximately 1500 W at a frequency of approximately 20 to approximately 40 MHz, and a mixed gas of $N_2$ and $H_2$, a mixed gas of $N_2$ and $O_2$, or a gas in which $CH_{4F}$, $CO$ or $CO_2$ is added to a mixed gas of $N_2$ and $H_2$. The photoresist pattern 420 and the BARC layer 418 have a similar etch selectivity, and are therefore removed during the etch process of the second hard mask layer 414.

Figure 4D:
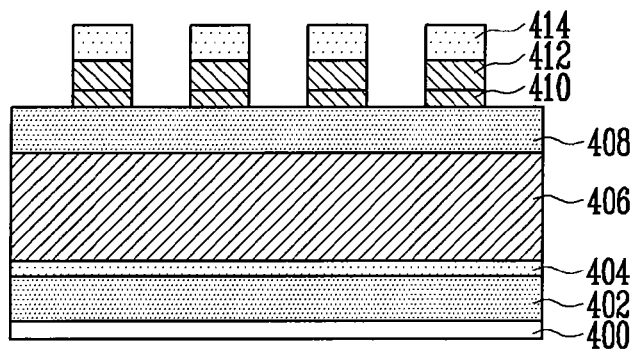

Referring to FIG. 4D, the first hard mask layer 412 and the first silicon oxynitride layer 410 are etched using the second silicon oxynitride layer 416 and the second hard mask layer 414 as masks. The first hard mask layer 412 and the first silicon oxynitride layer 410 can be etched using a pressure of approximately 100 to approximately 200 mT, a source power of approximately 100 to approximately 200 W at a frequency of approximately 20 to approximately 40 MHz, a bias power of approximately 200 to approximately 1000 W at a frequency of approximately 1 to approximately 10 MHz, and a mixed gas of $CF_4$, $CHF_3$ and $O_2$. The BARC layer 418, the second silicon oxynitride layer 416, the second hard mask layer 414, the first hard mask layer 412 and the first silicon oxynitride layer 410 are removed in-situ using ICP-type equipment. The second silicon oxynitride layer 416 is removed during the etch process of the first hard mask layer 412 and the first silicon oxynitride layer 410, and the second hard mask layer 414 is partially removed during the etch process of the first hard mask layer 412 and the first silicon oxynitride layer 410.

Figure 4E:
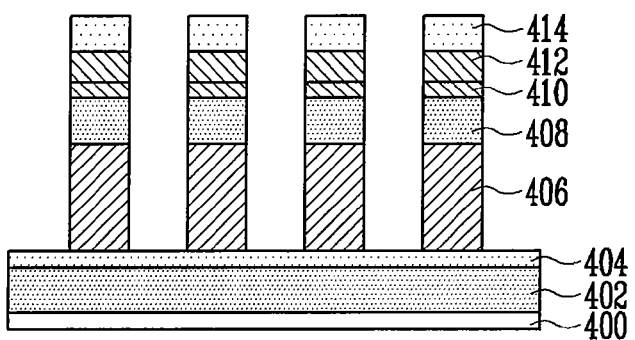

Referring to FIG. 4E, the tungsten silicide layer 408 and the conductive layer 406 are etched using the remaining second hard mask layer 414 as a mask. The tungsten silicide layer 408 is etched using a two-step etch process. The tungsten silicide layer 408 is first etched using a mixed gas of $NF_3$, $Cl_2$, $O_2$ and $N_2$ at a pressure of approximately 3 to approximately 15 mT and is then over-etched using a mixed gas of $Cl_2$, Ar and $N_2$. During the over-etch process of the tungsten silicide layer 408, the tungsten silicide layer 408 is removed without damaging the dielectric layer 404 such that the etch rate of the tungsten silicide layer 408 is set from approximately 20 to approximately 50 angstroms/sec while maintaining the etch selectivity between the tungsten silicide layer 408 and the dielectric layer 404 from approximately 10:1 to approximately 30:1.

The conductive layer 406 is etched using a mixed gas of HBr and $O_2$ where the ratio of the source power and the bias power is set from approximately 1:1 to approximately 2:1 at a pressure of approximately 10 to approximately 50 mT. Therefore, the conductive layer 406 has a vertical profile.

Figure 4F:
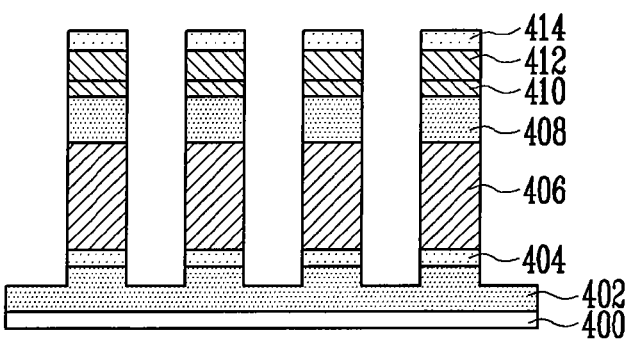

Referring to FIG. 4F, the dielectric layer 404 is etched using the remaining second hard mask layer 414 as a mask. The dielectric layer 404 can be etched using $CF_4$ at a pressure of approximately 3 to approximately 15 mT.

Figure 4G:
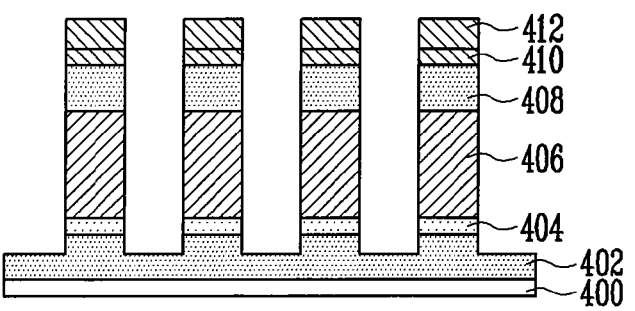

Referring to FIG. 4G, the second hard mask layer 414, which remains after the conductive layer for the floating gate that is formed in the active region is removed, is removed to form a gate 422 having a structure in which the dielectric layer 404, the conductive layer 406, the tungsten silicide (WSix) layer 408, the first silicon oxynitride layer 410 and the first hard mask layer 412 are stacked. The first hard mask layer 412, the first silicon oxynitride layer 410, the tungsten silicide (WSix) layer; 408, the conductive layer 406 and the dielectric layer 404 are etched in-situ using ICP-type equipment.

As described above, after the etch process is performed up to the first silicon oxynitride layer 410, the remaining etch process is performed using the second hard mask layer 414 as a mask without removing the second hard mask layer 414, thus forming the gate 422. Since the second hard mask layer 414 remains until the gate (422) pattern is formed, the first hard mask layer 412 is not removed. Thus, the thickness of the first hard mask layer 412 can be lowered. During the etch process of the first hard mask layer 412, the CD can be controlled easily. Even during formation of the gate 422, the sides of the etched gate (422) pattern are not passivated due to material containing carbon, which is generated as the ACL. In other words, the second hard mask layer 414 is removed. Consequently, the sides of the etched gate (422) pattern are not attached.

As described above, the present invention has the following advantages.

First, during the etch process of the first conductive layer, the second hard mask layer is used as a mask. Thus, the first conductive layer can be removed while sides of the etched gate pattern are not attached as an etch target increases.

Second, during the etch process of the first conductive layer, the second hard mask layer is used as a mask. Thus, a profile slope decreases as an etch target increases and, therefore, the coupling ratio can be controlled artificially.

Third, during the etch process of the first hard mask layer, the CD can be controlled easily. Even during formation of the gate, the sides of the etched gate pattern are not passivated due to material containing carbon, which is generated as the ACL. In other words, the second hard mask layer is removed. Accordingly, the sides of the etched gate pattern are not attached.

Fourth, during the gate etch process, an increase of variation in the threshold voltage (Vt), which is caused by a defective photoresist pattern due to a short photoresist pattern margin, can be improved. It is possible to prevent the active region from being damaged or the polysilicon layer from partially remaining.

Although the foregoing description has been made with reference to specific embodiments, it is to be understood that changes and modifications of the present patent may be made by one having ordinary skill in the art without departing from the spirit and scope of the present patent and appended claims.

What is claimed is:

1. A method of manufacturing a semiconductor device, the method comprising: providing a semiconductor substrate in which a floating gate pattern is formed; forming a dielectric layer over the floating gate pattern, a conductive layer for a control gate over the dielectric layer, a tungsten silicide layer over the conductive layer, a first silicon oxynitride layer over the tungsten silicide layer, a hard mask layer over the first silicon oxynitride layer, a second silicon oxynitride layer over the hard mask layer and an Organic Bottom Anti-Reflective Coating (BARC) layer over the second silicon oxynitride layer; partially etching the BARC layer, the second silicon oxynitride layer, the hard mask layer and the first silicon oxynitride layer; partially etching the tungsten silicide layer and the conductive layer for the control gate; partially etching the dielectric layer to form spacers on sides of the floating gate; and partially etching the floating gate pattern.

2. The method of claim 1, wherein forming the floating gate pattern comprises:
   forming a tunnel insulating layer and a conductive layer for a floating gate over the semiconductor substrate;
   partially etching the conductive layer for the floating gate, the tunnel insulating layer and the semiconductor substrate to form trenches;
   filling the trenches with an insulating layer to form isolation layers; and
   partially etching top surfaces of the isolation layers in order to control an Effective Field Height (EFH) of the isolation layers.

3. The method of claim 1, wherein the hard mask layer comprises an oxide layer and an amorphous carbon layer (ACL), or an oxide layer and a polymer of a Spin On Coating (SOC) method.

4. The method of claim 3, wherein the oxide layer is formed at a thickness of approximately 300 to approximately 1000 angstroms.

5. The method of claim 1, wherein the BARC layer and the second silicon oxynitride layer are etched using a pressure of approximately 60 to approximately 200 mT, a source power of approximately 300 to approximately 1000 W at a frequency of approximately 20 to approximately 40 MHz, and a mixed gas of $CF_4$ and $O_2$.

6. The method of claim 3, wherein the ACL or the polymer of the SOC method is etched using a pressure of approximately 100 to approximately 200 mT, a source power of approximately 500 to approximately 1500 W at a frequency of approximately 20 to approximately 40 MHz, and a mixed gas of $N_2$ and $H_2$, a mixed gas of $N_2$ and $O_2$, or a gas in which $CH_3F$, $CO$ or $CO_2$ is added to a mixed gas of $N_2$ and $H_2$.

7. The method of claim 3, wherein the oxide layer and the first silicon oxynitride layer are etched using a pressure of approximately 100 to approximately 200 mT, a source power of approximately 100 to approximately 200 W at a frequency of approximately 20 to approximately 40 MHz, a bias power of approximately 200 to approximately 1000 W at a frequency of approximately 1 to approximately 10 MHz, and a mixed gas of $CF_4$, $CHF_3$ and $O_2$.

8. The method of claim 1, wherein the BARC layer, the second silicon oxynitride layer, the hard mask layer and the first silicon oxynitride layer are etched in-situ using Inductively Coupled Plasma (ICP) type equipment.

9. The method of claim 1, wherein the tungsten silicide layer is etched using a two-step etch process.

10. The method of claim 9, wherein a first-step etch process is performed using a mixed gas of $NF_3$, $Cl_2$, $O_2$ and $N_2$ at a pressure of approximately 3 to approximately 15 mT.

11. The method of claim 9, wherein a second-step etch process includes performing an over-etch using a mixed gas of $Cl_2$, Ar and $N_2$.

12. The method of claim 11, wherein during the over-etch process, an etch selectivity of the tungsten silicide layer and the dielectric layer is set from approximately 10:1 to approximately 30:1.

13. The method of claim 11, wherein during the over-etch process, an etch rate of the tungsten silicide layer is from approximately 20 to approximately 50 angstroms/sec.

14. The method of claim 1, wherein the conductive layer for the control gate is etched using a mixed gas of HBr and $O_2$ where a ratio of a source power and a bias power is set from approximately 1:1 to approximately 2:1 at a pressure of approximately 10 to approximately 50 mT.

15. The method of claim 1, wherein during etch of the conductive layer for the control gate, an etch selectivity of the conductive layer for the control gate and the dielectric layer is set from approximately 20:1 to approximately 200:1.

16. The method of claim 1, wherein the dielectric layer is etched using $CF_4$ at a pressure of approximately 3 to approximately 15 mT.

17. The method of claim 1, wherein during etch of the dielectric layer, an etch selectivity of the dielectric layer and the floating gate is set from approximately 1:1 to approximately 1.5:1.

18. The method of claim 1, wherein the spacers are formed at a thickness of approximately 200 to approximately 500 angstroms.

19. The method of claim 1, wherein the floating gate is etched using a two-step etch process.

20. The method of claim 19, wherein a first-step etch process is performed using a mixed gas of HBr and He.

21. The method of claim 19, wherein during a first-step etch process, an etch selectivity of the conductive layer for the floating gate and the tunnel insulating layer is set from approximately 10:1 to approximately 30:1.

22. The method of claim 19, wherein a second-step etch process is performed using a mixed gas of HBr and $O_2$.

23. The method of claim 19, wherein during a second-step etch process, an etch selectivity of the conductive layer for the floating gate and the tunnel insulating layer is set from approximately 50:1 to approximately 150:1.

24. The method of claim 1, wherein the tungsten silicide layer, the conductive layer for the control gate, the dielectric layer and the floating gate are etched in-situ using ICP-type equipment.

25. The method of claim 1, wherein during etch of the floating gate, the spacers remain at a thickness of approximately 0 to approximately 200 angstroms.

* * * * *